United States Patent
Chiba et al.

(10) Patent No.: US 7,459,915 B2
(45) Date of Patent: Dec. 2, 2008

(54) ELECTRIC CIRCUIT AND TEST APPARATUS FOR OUTPUTTING A RECOVERED CLOCK INPUT SIGNAL

(75) Inventors: Noriaki Chiba, Tokyo (JP); Takashi Ochi, Tokyo (JP)

(73) Assignee: Advantest Corporation, Tokyo (JP)

( * ) Notice: Subject to any disclaimer, the term of this patent is extended or adjusted under 35 U.S.C. 154(b) by 182 days.

(21) Appl. No.: 11/643,027

(22) Filed: Dec. 20, 2006

(65) Prior Publication Data
US 2008/0018345 A1 Jan. 24, 2008

(30) Foreign Application Priority Data
Jul. 20, 2006 (JP) ............................. 2006-198113

(51) Int. Cl.
G01R 27/28 (2006.01)
G01R 23/12 (2006.01)
H03H 11/26 (2006.01)
G06F 1/04 (2006.01)

(52) U.S. Cl. .................... 324/617; 324/76.53; 327/261; 327/291

(58) Field of Classification Search ................. 324/617, 324/76.53
See application file for complete search history.

(56) References Cited

U.S. PATENT DOCUMENTS

| | | | | |
|---|---|---|---|---|
| 4,805,195 A | * | 2/1989 | Keegan | ...................... 375/354 |
| 5,666,388 A | * | 9/1997 | Neron | ........................ 375/376 |
| 6,617,932 B2 | * | 9/2003 | Kushner et al. | ............... 331/11 |
| 6,956,395 B2 | * | 10/2005 | Oshima et al. | .............. 324/765 |

* cited by examiner

Primary Examiner—Diego Gutierrez
Assistant Examiner—Jeff Natalini
(74) Attorney, Agent, or Firm—Osha · Liang LLP

(57) ABSTRACT

There is provided an electric circuit that outputs a timing signal and a recovered clock. The electric circuit includes a delay circuit that delays a reference signal, a PLL section that delays an oscillation signal synchronized with the delayed reference signal by an offset delay amount to output the delayed oscillation signal when outputting the timing signal and changes a delay amount for the oscillation signal in a tracking range using the offset delay amount as a standard to output the oscillation signal in synchronization with a periodic signal when outputting the recovered clock, a delay amount separating section that separates a coarse component of an integral multiple of a period of the clock signal and a fine component less than the period of the clock signal from a system timing, and a delay setting section that sets a value obtained by subtracting an adjusted delay amount, which is an integral multiple of the period of the clock signal, from the coarse component as the delay amount of the delay circuit and sets a value obtained by adding the adjusted delay amount to the fine component as the offset delay amount if the tracking range in a negative direction is larger than the fine component.

5 Claims, 6 Drawing Sheets

ELECTRIC CIRCUIT AND TEST APPARATUS FOR OUTPUTTING A RECOVERED CLOCK INPUT SIGNAL

CROSS REFERENCE TO RELATED APPLICATION

The present application claims priority from a Japanese Patent Application No. 2006-198113 filed on Jul. 20, 2006, the contents of which are incorporated herein by reference.

BACKGROUND

1. Technical Field

The present invention relates to an electric circuit and a test apparatus. More particularly, the present invention relates to an electric circuit that outputs a recovered clock synchronized with a given periodic signal and a test apparatus that tests a device under test by means of a recovered clock obtained by regenerating an output signal output from the device under test.

2. Related Art

A test apparatus acquires an output signal output from a device under test through a timing comparator, and decides the good or bad for the acquired signal. When testing a device outputting an output signal in accordance with the application of an input signal, the test apparatus acquires the output signal at a timing at which a reference signal is delayed by the time according to a system timing. In addition, the system timing is a time interval between outputting a generation instruction for a certain test signal and really outputting this test signal from the test apparatus, and is determined by a process delay to generate the test signal by the test apparatus, a delay amount of a wire, and so on.

Moreover, when testing a device outputting a signal including therein a clock, the test apparatus acquires an output signal at a timing according to a recovered clock recovered from the output signal, as disclosed, for example, in Japanese Patent Application Publication No. 2005-285160. In this case, the test apparatus can acquire an output signal without delaying a recovered clock by the time according to a system timing.

Meanwhile, when acquiring an output signal not including therein a clock and an output signal including therein a clock output from the same device under test in a switching method, the test apparatus cannot switch the output signals with high precision because acquisition timings before and after switching may be largely off.

SUMMARY

Therefore, it is an object of an aspect of the present invention to provide an electric circuit and a test apparatus that can solve the foregoing problems. The above and other objects can be achieved by combinations described in the independent claims. The dependent claims define further advantageous and exemplary combinations of the present invention.

To solve the above problem, according to the first aspect of the present invention, there is provided an electric circuit including a function for outputting a timing signal with a phase according to a predetermined system timing and a function for outputting a recovered clock synchronized with a given periodic signal. The electric circuit includes: a counter delay circuit that delays a given reference signal by a delay amount according to the system timing, which is an integral multiple of a period of a given clock signal and outputs the delayed reference signal; a PLL section that generates an oscillation signal synchronized with the reference signal delayed by the counter delay circuit, and delays the oscillation signal by an offset delay amount according to the system timing to output the delayed oscillation signal when outputting the timing signal and changes a delay amount for the oscillation signal in a preset tracking range using the offset delay amount as a standard to output the oscillation signal in synchronization with the periodic signal when outputting the recovered clock; a delay amount separating section that separates a coarse component of an integral multiple of a period of the clock signal and a fine component less than the period of the clock signal from the delay amount by which the reference signal should be delayed in accordance with the system timing; a difference computing section that computes a difference between the size of the tracking range in a negative direction and the size of the fine component if the tracking range in the negative direction is larger than the fine component; and a delay setting section that sets a value obtained by subtracting an adjusted delay amount, which is not less than the difference computed from the difference computing section and is an integral multiple of the period of the clock signal, from the coarse component as the delay amount of the counter delay circuit and sets a value obtained by adding the adjusted delay amount to the fine component as the offset delay amount of the PLL section, if the tracking range in the negative direction is larger than the fine component.

Delay resolution in the PLL section may be smaller than delay resolution in the counter delay circuit. The delay setting section may set the coarse component as the delay amount of the counter delay circuit and set the fine component as the offset delay amount of the PLL section if the tracking range in the negative direction is not more than the fine component. The delay setting section may compute a minimum delay amount, among delay amounts that are not less than the difference computed from the difference computing section and are an integral multiple of the period of the clock signal, as the adjusted delay amount if the tracking range in the negative direction is larger than the fine component.

According to the second aspect of the present invention, there is provided a test apparatus that tests a device under test. The test apparatus includes: a signal input section that inputs a test signal into the device under test; a measuring section that has a function for measuring a level of an output signal from the device under test in accordance with a timing signal generated using a predetermined system timing as a standard and a function for generating a recovered clock synchronized with the output signal and measuring the level of the output signal in accordance with the recovered clock; and a deciding section that decides the good or bad of the device under test based on the measurement result in the measuring section, in which the measuring section includes: an electric circuit that outputs either of the timing signal or the recovered clock; and a timing comparator that detects a level of the output signal in accordance with the timing signal or the recovered clock output from the electric circuit, and the electric circuit includes: a counter delay circuit that delays a given reference signal by a delay amount according to the system timing, which is an integral multiple of a period of a given clock signal and outputs the delayed reference signal; a PLL section that generates an oscillation signal synchronized with the reference signal delayed by the counter delay circuit, and delays the oscillation signal by an offset delay amount according to the system timing to output the delayed oscillation signal when outputting the timing signal and changes a delay amount for the oscillation signal in a preset tracking range using the offset delay amount as a standard to output the oscillation signal in synchronization with the periodic signal when outputting the recovered clock; a delay amount separating section that separates a coarse component of an integral multiple of a period of the clock signal and a fine component less than the period of the clock signal from the delay amount by which the reference signal should be delayed in accordance with the system timing; a difference computing section that computes a difference between the size of the tracking range in a negative direction and the size of the fine component if the tracking range in the negative direction is larger than the fine component; and a delay setting section that sets a value obtained by subtracting an adjusted delay amount, which is not less than the difference computed from the difference computing section and is an integral multiple of the period of the clock signal, from the coarse component as the delay amount of the counter delay circuit and sets a value obtained by adding the adjusted delay amount to the fine component as the offset delay amount of the PLL section, if the tracking range in the negative direction is larger than the fine component.

The summary does not necessarily describe all necessary features of the present invention. The present invention may also be a sub-combination of the features described above.

BRIEF DESCRIPTION OF THE DRAWINGS

FIG. 4 is a view exemplary showing a system timing or the like.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
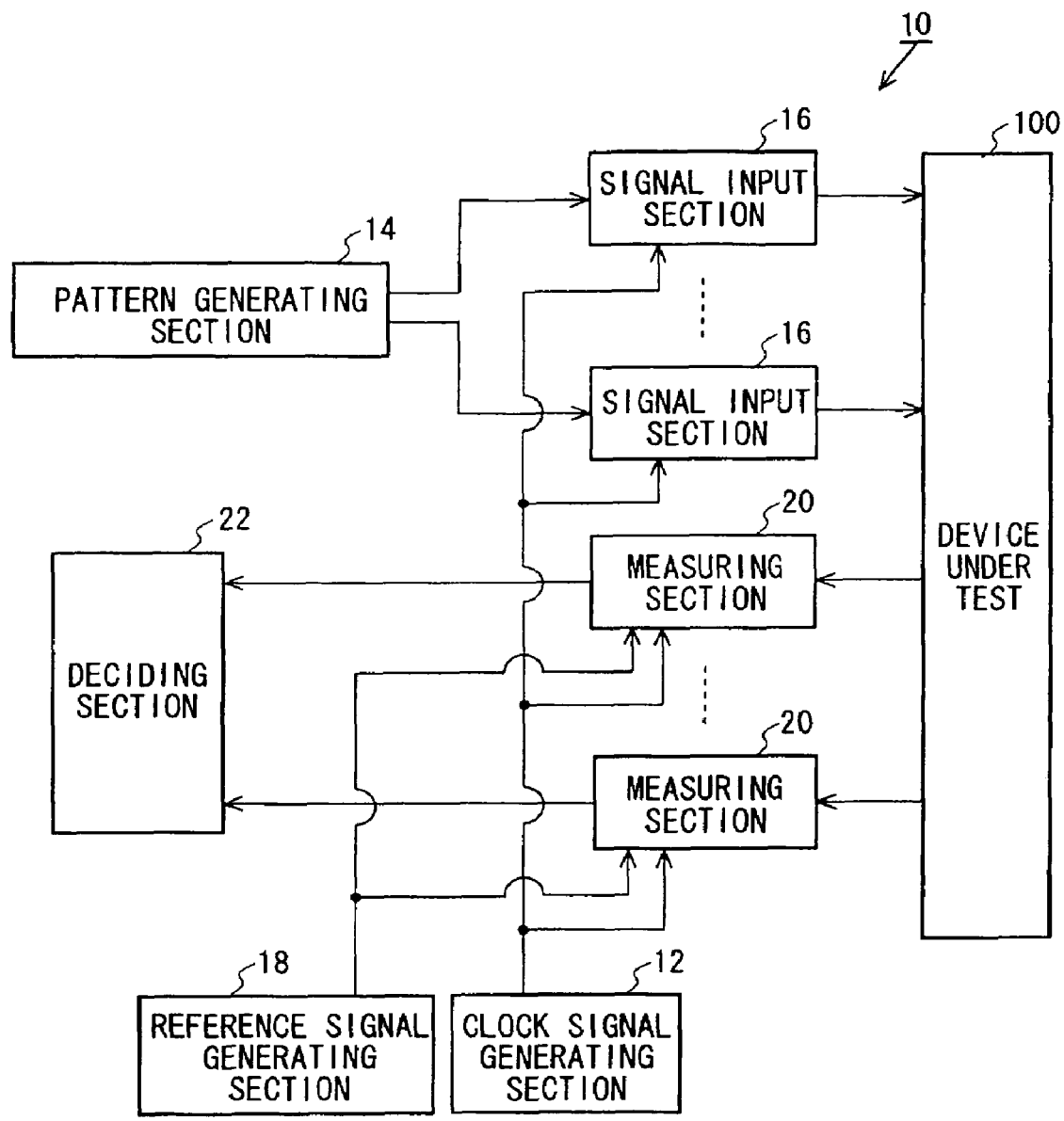
FIG. 1 is a view showing a configuration of a test apparatus 10 according to an embodiment of the present invention along with a device under test 100.

FIG. 1 is a view showing a configuration of a test apparatus 10 according to an embodiment of the present invention along with a device under test 100. The test apparatus 10 acquires an output signal output from the device under test 100, and decides the good or bad of the acquired signal to test the device under test 100. Furthermore, the test apparatus 10 can selectively acquire an output signal output in accordance with a test signal without including therein a clock and an output signal as a periodic signal including therein a clock, from the same pin of the device under test 100.

The test apparatus 10 includes a clock signal generating section 12, a pattern generating section 14, at least one signal input section 16, a reference signal generating section 18, at least one measuring section 20, and a deciding section 22. The clock signal generating section 12 outputs a clock signal that is an operation clock for this test apparatus 10. The pattern generating section 14 generates a waveform pattern to be supplied to the device under test 100 as a test signal. Each of the signal input sections 16 is provided corresponding to each input pin of the device under test 100. Then, each of the signal input sections 16 generates a test signal according to a test pattern generated from the pattern generating section 14 to input the test signal into the device under test 100. Each of the signal input sections 16 operates based on the clock signal generated from the clock signal generating section 12.

The reference signal generating section 18 outputs a reference signal showing the timing at which an output signal output from the device under test 100 should be acquired. Each of the measuring sections 20 is provided corresponding to each output pin of the device under test 100. Then, each of the measuring sections 20 has a function for measuring a level of the output signal from the device under test 100 in accordance with a timing signal generated using a predetermined system timing as a standard and a function for generating a recovered clock synchronized with the output signal and measuring a level of the output signal in accordance with the recovered clock.

When deciding the good or bad of an output signal not including therein a clock, which is output from the device under test 100, the measuring section 20 measures a level of the output signal from the device under test 100 in accordance with a timing signal generated using a predetermined system timing as a standard. Moreover, when deciding the good or bad of an output signal including therein a clock, which is output from the device under test 100, the measuring section 20 generates a recovered clock synchronized with this output signal and measures a level of the output signal in accordance with the recovered clock. Furthermore, each of the measuring sections 20 operates based on the clock signal generated from the clock signal generating section 12 and the reference signal output from the reference signal generating section 18. The deciding section 22 decides the good or bad of the device under test 100 based on a measurement result in each of the measuring sections 20.

Figure 2:
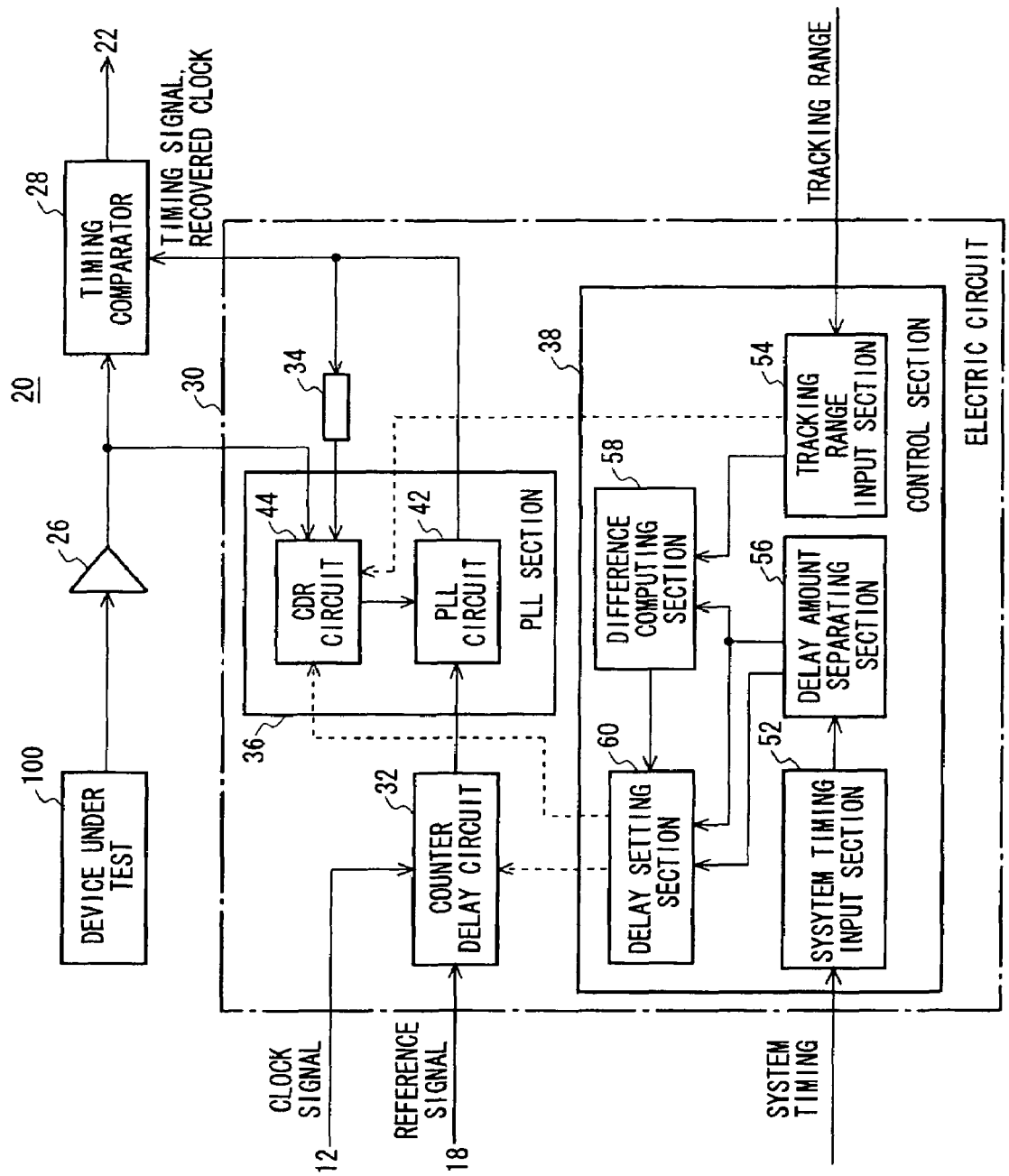
FIG. 2 is a view showing a configuration of a measuring section 20 according to an embodiment of the present invention along with a device under test 100.

FIG. 2 is a view showing a configuration of the measuring section 20 according to an embodiment of the present invention along with the device under test 100. The measuring section 20 has a level comparator 26, a timing comparator 28, and an electric circuit 30. The level comparator 26 digitalizes an output signal output from the device under test 100 at a predetermined threshold level. The timing comparator 28 detects a level of the output signal in accordance with the timing signal or the recovered clock output from the electric circuit 30. In other words, the timing comparator 28 acquires the output signal digitalized by the level comparator 26 at the timing of the timing signal or the recovered clock. Then, the timing comparator 28 sends out the acquired digitalized output signal to the subsequent-stage deciding section 22.

The electric circuit 30 outputs either the timing signal or the recovered clock. The electric circuit 30 outputs a timing signal with a phase according to a predetermined system timing when deciding the good or bad of an output signal not including therein a clock and outputs a recovered clock synchronized with an output signal when deciding the good or bad of the output signal including therein a clock.

The electric circuit 30 includes a counter delay circuit 32, a variable delay circuit 34, a PLL (Phase Locked Loop) section 36, and a control section 38.

The counter delay circuit 32 delays a given reference signal by a delay amount according to the system timing, which is an integral multiple of a period of a given clock signal, and outputs the delayed reference signal. The variable delay circuit 34 delays the recovered clock by a predetermined delay amount. As an example, the variable delay circuit 34 may delay the recovered clock by a delay amount according to a propagation delay time from when the output signal is output from the device under test 100 to when the output signal is input into the timing comparator 28.

The PLL section 36 generates an oscillation signal synchronized with the reference signal delayed by the counter delay circuit 32. Then, when outputting the timing signal (in other words, when deciding the good or bad of an output signal not including therein a clock), the PLL section 36 delays this oscillation signal by an offset delay amount according to the system timing, and outputs the delayed signal. Moreover, when outputting the recovered clock (in other words, when deciding the good or bad of an output signal including therein a clock), the PLL section 36 changes a delay amount for the oscillation signal in a preset tracking range using the offset delay amount as a standard, in order to output the oscillation signal in synchronization with the output signal.

In addition, delay resolution in the PLL section 36 is smaller than delay resolution in the counter delay circuit 32. In other words, the PLL section 36 can change a delay amount of the oscillation signal for the reference signal with accuracy less than a period of a clock signal.

As an example, the PLL section 36 may have a PLL circuit 42 and a CDR (Clock Data Recovery) circuit 44. The PLL circuit 42 outputs an oscillation signal with a phase delayed from a phase of the reference signal delayed by the counter delay circuit 32 by a delay amount given by the CDR circuit 44, in which the oscillation signal has frequency of predetermined several times of frequency of the reference signal.

The CDR circuit 44 provides the offset delay amount predetermined in accordance with the system timing to the PLL circuit 42, when the PLL circuit 42 outputs an oscillation signal as a timing signal. The CDR circuit 44 provides a delay amount according to a phase difference between a clock included in the output signal from the device under test 100 and the reference signal to the PLL circuit 42, when the PLL circuit 42 outputs an oscillation signal as a recovered clock. As an example, the CDR circuit 44 may accumulate a phase difference between the recovered clock delayed by the variable delay circuit 34 and the output signal, in order to compute a delay amount according to a phase difference between the output signal and the reference signal. In this case, the CDR circuit 44 may use the offset delay amount predetermined in accordance with the system timing as an early delay amount to be given to the PLL circuit 42.

The control section 38 sets a delay amount with an accuracy of an integral multiple of a period of the clock signal for the counter delay circuit 32 and sets an offset delay amount with an accuracy less than the period of the clock signal for the PLL section 36. More in detail, the control section 38 includes a system timing input section 52, a tracking range input section 54, a delay amount separating section 56, a difference computing section 58, and a delay setting section 60. The system timing input section 52 inputs a system timing, for example, previously measured during calibration. Then, the system timing input section 52 computes a delay amount by which a reference signal is delayed in accordance with the system timing.

The tracking range input section 54 inputs a tracking range set by a user or the like. When the PLL section 36 outputs a recovered clock (in other words, when deciding the good or bad of an output signal including therein a clock), a tracking range is a range in which the PLL section 36 changes a phase of the recovered clock. In the tracking range, there is respectively set a tracking range from a reference phase to a positive direction (a direction in which a phase advances) and a tracking range from the reference phase to a negative direction (a direction in which a phase delays). The tracking range input section 54 sets an operating range of the PLL section 36 in order to change the phase of the recovered clock within the input tracking range. As an example, the tracking range input section 54 may adjust a variable range of the delay amount output from the CDR circuit 44 in accordance with the input tracking range.

The delay amount separating section 56 separates a coarse component of an integral multiple of a period of the clock signal and a fine component less than the period of the clock signal from the delay amount by which the reference signal should be delayed in accordance with the system timing. The difference computing section 58 computes a difference between the size of the tracking range in the negative direction and the size of the fine component if the tracking range in the negative direction is larger than the fine component.

The delay setting section 60 sets a value obtained by subtracting an adjusted delay amount, which is not less than the difference computed from the difference computing section 58 and is an integral multiple of the period of the clock signal, from the coarse component as the delay amount of the counter delay circuit 32, if the tracking range in the negative direction is larger than the fine component. Furthermore, the delay setting section 60 sets a value obtained by adding the adjusted delay amount to the fine component as the offset delay amount of the PLL section 36, if the tracking range in the negative direction is larger than the fine component. Here, if the tracking range in the negative direction is larger than the fine component, the delay setting section 60 may compute, as an example, a minimum delay amount, among delay amounts that are not less than the difference computed from the difference computing section 58 and are an integral multiple of the period of the clock signal, as an adjusted delay amount, and set a value obtained by subtracting this adjusted delay amount from the coarse component as a delay amount of the counter delay circuit 32. Moreover, if the tracking range in the negative direction is not more than the fine component, the delay setting section 60 sets the coarse component as a delay amount of the counter delay circuit 32. Furthermore, if the tracking range in the negative direction is not more than the fine component, the delay setting section 60 sets the fine component as an offset delay amount of the PLL section 36.

Figure 3:
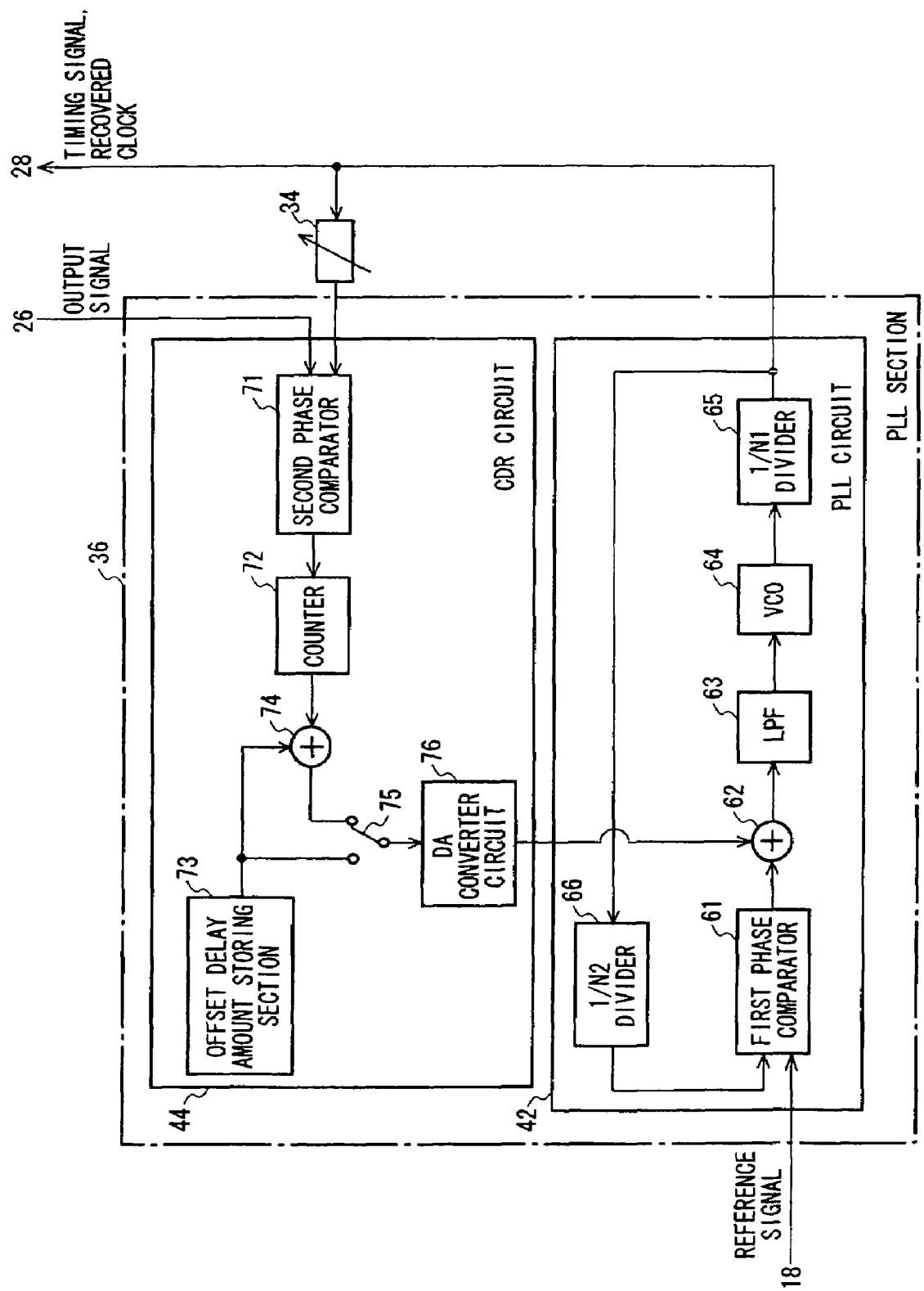
FIG. 3 is a view exemplary showing a configuration of a PLL section 36 along with a variable delay circuit 34.

FIG. 3 is a view exemplary showing a configuration of the PLL circuit 42 and the CDR circuit 44 along with the variable delay circuit 34 according to the present embodiment. As an example, the PLL circuit 42 has a first phase comparator 61, a first adder 62, an LPF 63, a VCO 64, a 1/N1 divider 65, and a 1/N2 divider 66, and may generate an oscillation signal (a timing signal or a recovered clock) with frequency of an integral multiple of a reference signal.

The first phase comparator 61 detects a phase difference between a reference signal output from the reference signal generating section 18 and a signal output from the 1/N2 divider 66, and outputs a signal having duty according to the detected phase difference. The first adder 62 adds a control signal output from the CDR circuit 44 to a voltage of the signal output from the first phase comparator 61. The LPF 63 outputs a control voltage obtained by smoothing the voltage output from the first adder 62. The VCO 64 outputs a signal with frequency according to the control voltage output from the LPF 63. The 1/N1 divider 65 divides frequency of the signal output from the VCO 64 by 1/N1 (N1 is an integer number.).

The 1/N2 divider 66 divides frequency of a signal output from the 1/N1 divider 65 by 1/N2 (N2 is an integer number.). Then, the PLL circuit 42 outputs the signal output from the 1/N1 divider 65 as an oscillation signal. The PLL circuit 42 having such a configuration can output the oscillation signal delayed from the reference signal by a phase according to a voltage value of the control signal output from the CDR circuit 44, in which the oscillation signal has frequency obtained by multiplying the frequency of reference signal by N2.

As an example, the CDR circuit 44 has a second phase comparator 71, a counter 72, an offset delay amount storing section 73, a second adder 74, a switching section 75, and a DA converter circuit 76, and outputs a control signal with a voltage value according to a delay amount to be supplied to the PLL circuit 42.

The second phase comparator 71 detects a phase difference between an oscillation signal delayed by the variable delay circuit 34 and an output signal, and outputs a signal having duty according to the detected phase difference. The counter 72 performs an up counting operation or a down counting operation in accordance with the output signal from the second phase comparator 71. As an example, the counter 72 performs an up counting operation if the output signal from the second phase comparator 71 is a high level and performs a down counting operation if the output signal from the second phase comparator 71 is a low level. In this way, the counter 72 can accumulate and output digital values according to phase differences between the oscillation signals delayed by the variable delay circuit 34 and the output signals.

The offset delay amount storing section 73 stores an offset delay amount set by the delay setting section 60. The second adder 74 adds the offset delay amount stored on the offset delay amount storing section 73 and the count value output from the counter 72. The switching section 75 selects the offset delay amount stored on the offset delay amount storing section 73 when deciding the good or bad of an output signal not including therein a clock and selects the value added by the second adder 74 when deciding the good or bad of an output signal including therein a clock.

The DA converter circuit 76 outputs a control signal with a voltage value according to the value selected by the switching section 75. In other words, the DA converter circuit 76 outputs a control signal with a voltage value according to the offset delay amount when deciding the good or bad of an output signal not including therein a clock. Moreover, the DA converter circuit 76 outputs a control signal with a voltage value according to the value obtained by adding the count value of the counter 72 and the offset delay amount when deciding the good or bad of an output signal including therein a clock.

When deciding the good or bad of an output signal not including therein a clock, such the CDR circuit 44 can output a timing signal having a phase delayed from the reference signal by the offset delay amount. Moreover, such the CDR circuit 44 can output a recovered clock having a phase delayed from the reference signal by the phase difference between the output signal and the reference signal when deciding the good or bad of the output signal including therein a clock. In other words, such the CDR circuit 44 can output a recovered clock synchronized with an output signal when deciding the good or bad of the output signal including therein a clock. Furthermore, since the reference signal is delayed in accordance with the value obtained by adding the offset delay amount to the count value output from the counter 72 when deciding the good or bad of the output signal including therein a clock, such the CDR circuit 44 can adjust a phase of the recovered clock in a negative direction and in a positive direction with a central focus on a phase according to the offset delay amount.

Figure 4:
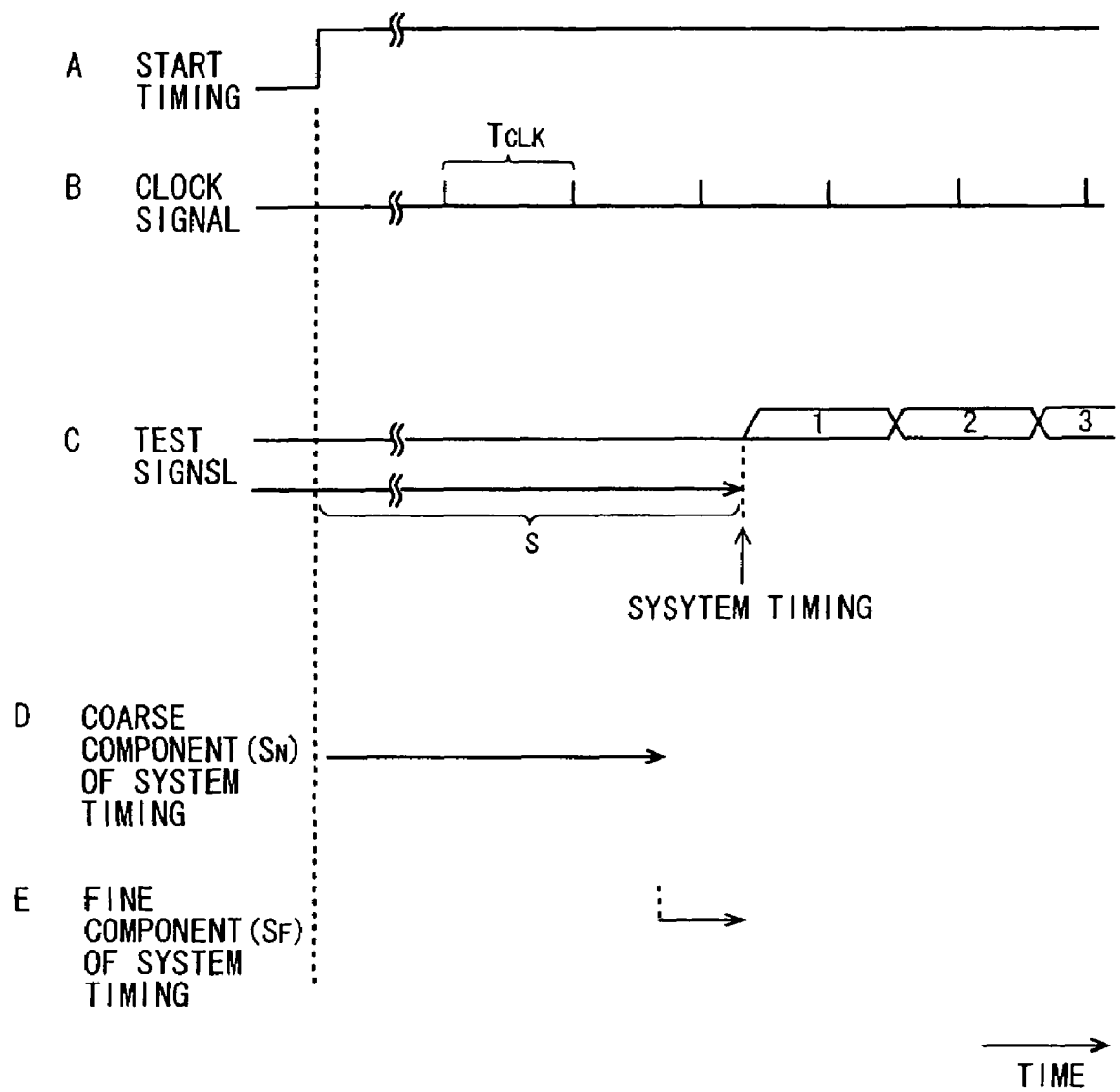

FIG. 4A shows a start timing, FIG. 4B shows an example of a clock signal, FIG. 4C shows an example of a test signal, FIG. 4D shows an example of a component $S_N$ of an integral multiple of a period of a clock signal of a system timing S, and FIG. 4E shows an example of a component $S_F$ less than the period of the clock signal of the system timing S.

The test apparatus 10 measures the system timing S during calibration. The system timing S is a time instant at which the application of the test signal to the device under test 100 is started in case that a timing (a start timing) at which the test apparatus 10 starts an operation is used as a reference time instant. In other words, the system timing S shows a delay time from outputting an instruction for generating a certain test signal to really outputting this test signal from this test apparatus 10, and is determined by a process delay amount generating the test signal, a wire delay amount, and so on in this test apparatus 10.

The test apparatus 10 measures the system timing S with accuracy less than a period $T_{CLK}$ of a clock signal. The system timing input section 52 inputs the measured system timing S. Then, the delay amount separating section 56 separates a component (coarse component $S_N$) of an integral multiple of the period $T_{CLK}$ of the clock signal and a component (fine component $S_F$) less than the period $T_{CLK}$ of the clock signal from the system timing S.

Figure 5:
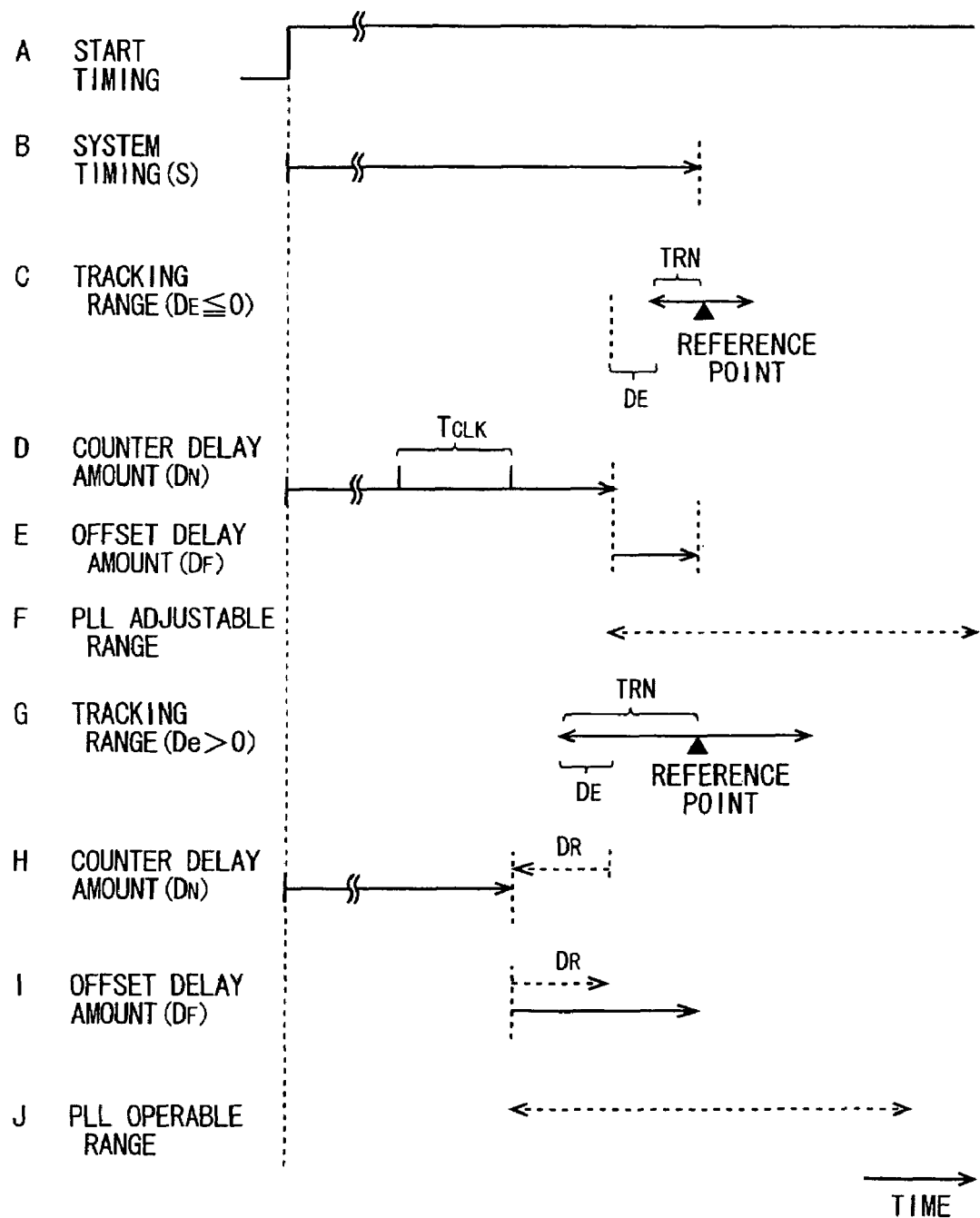
FIG. 5 is a view showing a set value or the like of a delay amount in a PLL section 36.

FIG. 5A shows a start timing and FIG. 5B shows an example of the system timing S. FIG. 5C shows an example of a tracking range in case that a tracking range TRN in a negative direction is not more than the component (fine component $S_F$) less than the period $T_{CLK}$ of the clock signal of the system timing S. FIG. 5D shows an example of a delay amount (a counter delay amount $D_N$) by the counter delay circuit 32 in case that the tracking range TRN in the negative direction is not more than the fine component $S_F$, FIG. 5E shows an example of an offset delay amount $D_F$ of the PLL section 36 in case that the tracking range TRN in the negative direction is not more than the fine component $S_F$, and FIG. 5F shows an example of a delay amount adjustable range of the PLL section 36 in case that the tracking range TRN in the negative direction is not more than the fine component $S_F$. FIG. 5G shows an example of a tracking range in case that the tracking range TRN in the negative direction is larger than the fine component $S_F$, FIG. 5H shows an example of the delay amount (the counter delay amount $D_N$) by the counter delay circuit 32 in case that the tracking range TRN in the negative direction is larger than the fine component $S_F$, FIG. 5I shows an example of the offset delay amount $D_F$ of the PLL section 36 in case that the tracking range TRN in the negative direction is larger than the fine component $S_F$, and FIG. 5J shows an example of a delay amount adjustable range of the PLL section 36 in case that the tracking range TRN in the negative direction is larger than the fine component $S_F$.

When the good or bad of an output signal not including therein a clock is decided during testing the device under test 100, the delay setting section 60 sets the component (coarse component $S_N$) of an integral multiple of the period $T_{CLK}$ of the clock signal at the system timing S as the counter delay amount $D_N$ of the counter delay circuit 32, and sets the component (fine component $S_F$) less than the period $T_{CLK}$ of the clock signal at the system timing S as the offset delay amount $D_F$ of the PLL section 36. As an example, the delay setting section 60 may set the coarse component $S_N$ as shown in the following equation (1) as the counter delay amount $D_N$ of the counter delay circuit 32, and set fine component $S_F$ as shown in follows equation (2) as the offset delay amount $D_F$ of the PLL section 36.

$$D_N = S_N = (S/T_{CLK}) \times T_{CLK} \tag{1}$$

$$D_F = S_F = (S \bmod T_{CLK}) \tag{2}$$

In addition, $(S/T_{CLK})$ shows the quotient when dividing S by $T_{CLK}$. Moreover, $(S \bmod T_{CLK})$ shows the remainder when dividing S by $T_{CLK}$. These are similar in the subsequent equations.

The counter delay circuit 32 for which such a delay amount has been set delays an input reference signal by the coarse component $S_N$. Then, the PLL section 36 for which such an offset delay amount has been set generates a timing signal having a phase obtained by further delaying the reference signal delayed by the counter delay circuit 32 by the fine component $S_F$. As a result, the PLL section 36 can output a timing signal obtained by delaying the reference signal by the system timing S. Therefore, the test apparatus 10 can harmonize a delay amount of an output signal generated from the device under test 100 in accordance with the test signal delayed by the system timing S with a delay amount of a timing signal acquiring this output signal. In this way, the test apparatus 10 can acquire an output signal generated from the device under test 100 at a correct timing to decide the quality of the device under test.

Moreover, when the good or bad of an output signal including therein a clock is decided during testing the device under test 100, the tracking range input section 54 inputs a tracking range set by a user or the like in advance of testing the device under test 100. The tracking range input section 54 computes a result (a difference $D_E$) obtained by subtracting the fine component $S_F$ from a range (a tracking range TRN) in the negative direction (a direction in which a phase delays) from a reference point in the tracking range. As an example, the tracking range input section 54 may compute the difference $D_E$ as shown in the following equation (3).

$$D_E = TRN - (S \bmod T_{CLK}) \tag{3}$$

Then, the delay setting section 60 switches the delay amounts set in the counter delay circuit 32 and the PLL section 36 between when the difference $D_E$ as shown in FIG. 5C is not more than zero ($D_E \leq 0$) (in other words, when the tracking range TRN in the negative direction is not more than the fine component $S_F$) and when the difference $D_E$ as shown in FIG. 5G is larger than zero ($D_E > 0$) (in other words, when the tracking range TRN in the negative direction is larger than the fine component $S_F$).

In case that the difference $D_E$ is not more than zero ($D_E \leq 0$), the delay setting section 60 sets the coarse component $S_N$ as the counter delay amount $D_N$ of the counter delay circuit 32 as shown in FIG. 5D, and sets the fine component $S_F$ as the offset delay amount $D_F$ of the PLL section 36 as shown in FIG. 5E. As an example, the delay setting section 60 may set the coarse component $S_N$ shown in equation (1) as the counter delay amount $D_N$ of the counter delay circuit 32 and set the fine component $S_F$ shown in equation (2) as the offset delay amount $D_F$ of the PLL section 36.

Moreover, in case that the difference $D_E$ is larger than zero ($D_E > 0$), the delay setting section 60 sets a value obtained by subtracting the adjusted delay amount $D_R$, which is not less than the difference $D_E$ and is an integral multiple of the period $T_{CLK}$ of the clock signal, from the coarse component $S_N$ as the delay amount $D_N$ of the counter delay circuit 32 as shown in FIG. 5H. Furthermore, the delay setting section 60 sets a value obtained by adding the adjusted delay amount $D_R$ to the fine component $S_F$ as the offset delay amount $D_F$ of the PLL section 36 as shown in FIG. 5I.

As an example, the delay setting section 60 may compute the adjusted delay amount $D_R$ as shown in the following equation (4).

$$D_R = (X + (D_E / T_{CLK})) \times T_{CLK} \tag{4}$$

In addition, X is an integer number not less than one. $(D_E/T_{CLK})$ shows the quotient when dividing $D_E$ by $T_{CLK}$.

Then, as an example, the delay setting section 60 may set a value shown in equation (5) as the counter delay amount $D_N$ of the counter delay circuit 32 and set a value shown in equation (6) as the offset delay amount $D_F$ of the PLL section 36.

$$D_N = (S/T_{CLK}) \times T_{CLK} - D_R \tag{5}$$

$$D_F = (S \bmod T_{CLK}) + D_R \tag{6}$$

According to the PLL section 36 for which a delay amount has been set as described above, a phase of a recovered clock for a phase of a reference signal can be utilized as the system timing S at starting a PLL operation for synchronizing the recovered clock with an output signal when deciding the good or bad of the output signal including therein a clock.

Furthermore, when a delay amount has been set in this manner, the recovered clock output from the PLL section 36 is delayed from the phase of the reference signal by a delay amount obtained by adding the delay amount by the PLL section 36 to the coarse component $S_N$. In other words, the PLL section 36 can change the phase of the recovered clock for the phase of the reference signal from the coarse component $S_N$ to the delay amount obtained by adding a PLL adjustable range by the PLL section 36 to the coarse component $S_N$. Furthermore, such the PLL section 36 can change the phase of the recovered clock over the whole range of the tracking range TRN in the negative direction, which is set by a user or the like using the system timing S as a reference (e.g., a center) after starting the PLL operation.

In this way, the test apparatus 10 can continue to test the device under test without largely shifting a phase of an output signal (a timing signal and a recovered clock) even when the switching is performed from deciding the good or bad of the output signal not including therein a clock to deciding the good or bad of the output signal including therein a clock or even when the switching is adversely performed. Furthermore, the PLL section 36 can perform the control to change the phase of the recovered clock by the tracking range set by a user or the like at least when deciding the good or bad of an output signal including therein a clock.

Figure 6:
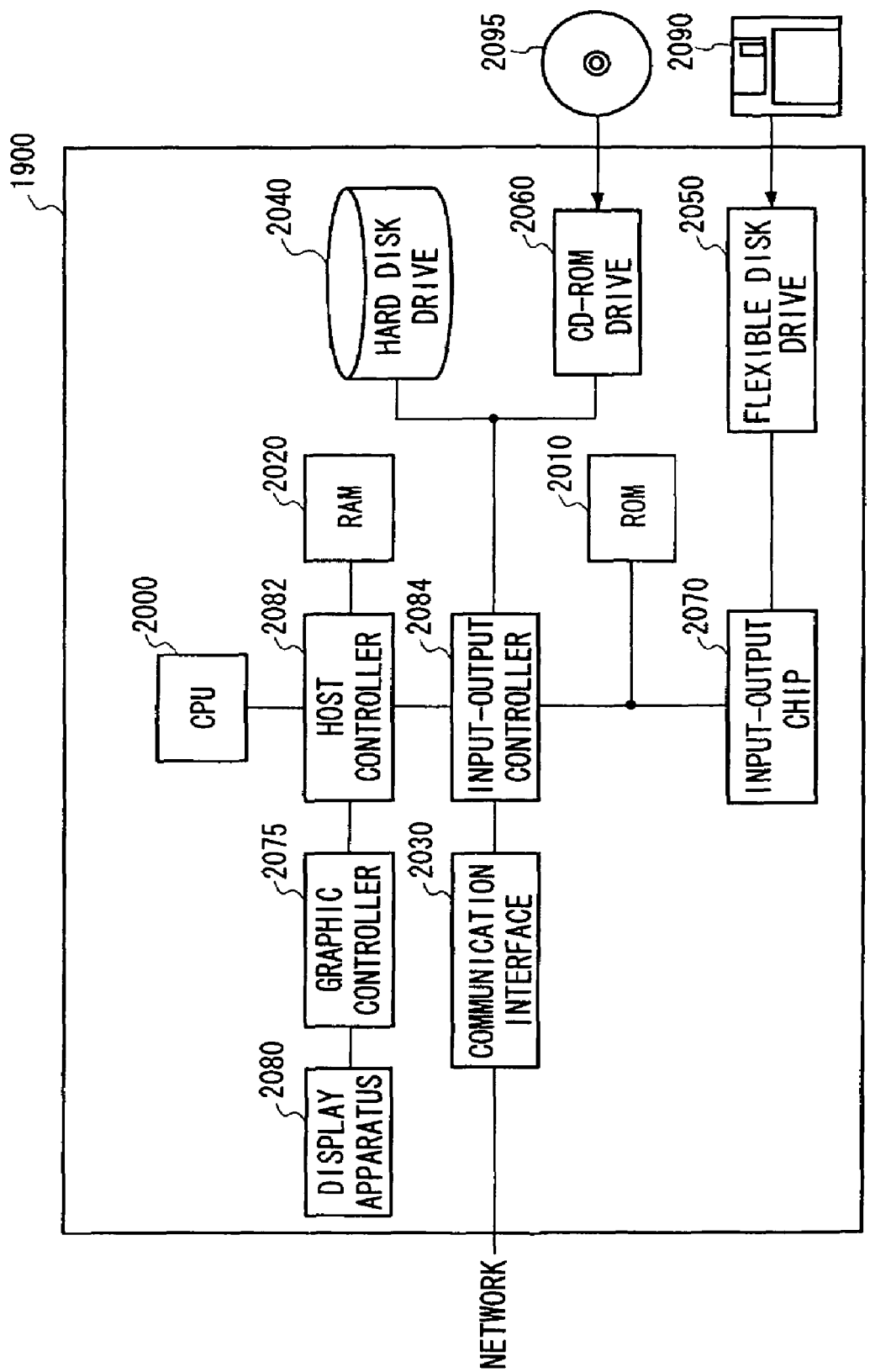
FIG. 6 is a view showing a hardware configuration of a computer 1900 according to the present embodiment.

FIG. 6 is a view showing a hardware configuration of a computer 1900 according to the present embodiment. The computer 1900 according to the present embodiment includes a CPU peripheral section, an input-output section, and a legacy input-output section. The CPU peripheral section has a CPU 2000, a RAM 2020, a graphic controller 2075, and a display apparatus 2080 that are interconnected by a host controller 2082. The input-output section has a communication interface 2030, a hard disk drive 2040, and a CD-ROM drive 2060 that are connected to the host controller 2082 by an input-output controller 2084. The legacy input-output section has a ROM 2010, a flexible disk drive 2050, and an input-output chip 2070 that are connected to the input-output controller 2084.

The host controller 2082 connects the RAM 2020 to the CPU 2000 and the graphic controller 2075 that access the RAM 2020 at high transfer rate. The CPU 2000 operates based on a program stored on the ROM 2010 and the RAM 2020, and controls each section. The graphic controller 2075 acquires image data to be generated by the CPU 2000 on a frame buffer provided in the RAM 2020, and displays the data on the display apparatus 2080. Alternatively, the graphic controller 2075 may include therein a frame buffer for storing image data generated from the CPU 2000.

The input-output controller 2084 connects the host controller 2082 to the communication interface 2030, the hard disk drive 2040, and the CD-ROM drive 2060 that are a comparatively fast input-output apparatus. The communication interface 2030 communicates with other apparatuses via network. The hard disk drive 2040 stores a program and data to be used by the CPU 2000 within the computer 1900. The CD-ROM drive 2060 reads a program or data from a CD-ROM 2095, and provides it to the hard disk drive 2040 via the RAM 2020.

Moreover, the ROM 2010, the flexible disk drive 2050, and the input-output chip 2070 that are a comparatively low-speed input-output apparatus are connected to the input-output controller 2084. The ROM 2010 stores a boot program to be executed by the computer 1900 on starting and a program or the like dependent on hardware of the computer 1900. The flexible disk drive 2050 reads a program or data from a flexible disk 2090, and provides it to the hard disk drive 2040 via the RAM 2020. The input-output chip 2070 connects a various types of input-output apparatuses via the flexible disk drive 2050 and a parallel port, a serial port, a keyboard port, a mouse port, or the like.

A program provided to the hard disk drive 2040 via the RAM 2020 is stored on the flexible disk 2090, the CD-ROM 2095, or a recording medium such as an IC card, to be provided by a user. A program is read from a recording medium, is installed in the hard disk drive 2040 within the computer 1900 via the RAM 2020, and is executed in the CPU 2000.

A program installed in the computer 1900 for making the computer 1900 as function as the control section 38 of the test apparatus 10 includes a system timing input module, a tracking range input module, a delay amount separating module, a differences computing module, and a delay setting module. This program works on the CPU 2000 or the like, and makes the computer 1900 respectively functions as the system timing input section 52, the tracking range input section 54, the delay amount separating section 56, the difference computing section 58, and the delay setting section 60.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to an embodiment of the present invention, it is possible to precisely switch a function for outputting a timing signal with a phase according to a predetermined system timing and a function for outputting a recovered clock synchronized with a given periodic signal. Moreover, according to the present invention, it is possible to realize an electric circuit and a test apparatus that can precisely switch a function for outputting a timing signal with a phase according to a predetermined system timing and a function for outputting a recovered clock synchronized with an output signal to test the device under test with high precision.

What is claimed is:

1. An electric circuit including a function for outputting a timing signal with a phase according to a predetermined system timing and a function for outputting a recovered clock synchronized with a given periodic signal, the electric circuit comprising:

a counter delay circuit that delays a given reference signal by a delay amount according to the system timing, which is an integral multiple of a period of a given clock signal and outputs the delayed reference signal;

a PLL section that generates an oscillation signal synchronized with the reference signal delayed by the counter delay circuit, and delays the oscillation signal by an offset delay amount according to the system timing to output the delayed oscillation signal when outputting the timing signal and changes a delay amount for the oscillation signal in a preset tracking range using the offset delay amount as a standard to output the oscillation signal in synchronization with the periodic signal when outputting the recovered clock;

a delay amount separating section that separates a coarse component of an integral multiple of a period of the clock signal and a fine component less than the period of the clock signal from the delay amount by which the reference signal should be delayed in accordance with the system timing;

a difference computing section that computes a difference between the size of the tracking range in a negative direction and the size of the fine component if the tracking range in the negative direction is larger than the fine component; and a delay setting section that sets a value obtained by subtracting an adjusted delay amount, which is not less than the difference computed from the difference computing section and is an integral multiple of the period of the clock signal, from the coarse component as the delay amount of the counter delay circuit and sets a value obtained by adding the adjusted delay amount to the fine component as the offset delay amount of the PLL section, if the tracking range in the negative direction is larger than the fine component.

2. The electric circuit as claimed in claim 1, wherein delay resolution in the PLL section is smaller than delay resolution in the counter delay circuit.

3. The electric circuit as claimed in claim 2, wherein the delay setting section sets the coarse component as the delay amount of the counter delay circuit and sets the fine component as the offset delay amount of the PLL section if the tracking range in the negative direction is not more than the fine component.

4. The electric circuit as claimed in claim 2, wherein the delay setting section computes a minimum delay amount, among delay amounts that are not less than the difference computed from the difference computing section and are an integral multiple of the period of the clock signal, as the adjusted delay amount if the tracking range in the negative direction is larger than the fine component.

5. A test apparatus that tests a device under test, the test apparatus comprising:

a signal input section that inputs a test signal into the device under test;

a measuring section that has a function for measuring a level of an output signal from the device under test in accordance with a timing signal generated using a predetermined system timing as a standard and a function for generating a recovered clock synchronized with the output signal and measuring the level of the output signal in accordance with the recovered clock; and a deciding section that decides the good or bad of the device under test based on the measurement result in the measuring section, the measuring section comprising:

an electric circuit that outputs either of the timing signal or the recovered clock; and a timing comparator that detects a level of the output signal in accordance with the timing signal or the recovered clock output from the electric circuit, and the electric circuit comprising:

a counter delay circuit that delays a given reference signal by a delay amount according to the system timing, which is an integral multiple of a period of a given clock signal and outputs the delayed reference signal;

a PLL section that generates an oscillation signal synchronized with the reference signal delayed by the counter delay circuit, and delays the oscillation signal by an offset delay amount according to the system timing to output the delayed oscillation signal when outputting the timing signal and changes a delay amount for the oscillation signal in a preset tracking range using the offset delay amount as a standard to output the oscillation signal in synchronization with the periodic signal when outputting the recovered clock;

a delay amount separating section that separates a coarse component of an integral multiple of a period of the clock signal and a fine component less than the period of the clock signal from the delay amount by which the reference signal should be delayed in accordance with the system timing;

a difference computing section that computes a difference between the size of the tracking range in a negative direction and the size of the fine component if the tracking range in the negative direction is larger than the fine component; and a delay setting section that sets a value obtained by subtracting an adjusted delay amount, which is not less than the difference computed from the difference computing section and is an integral multiple of the period of the clock signal, from the coarse component as the delay amount of the counter delay circuit and sets a value obtained by adding the adjusted delay amount to the fine component as the offset delay amount of the PLL section, if the tracking range in the negative direction is larger than the fine component.

* * * * *